United States Patent
Yoon et al.

(10) Patent No.: US 7,095,769 B2
(45) Date of Patent: Aug. 22, 2006

(54) SEMICONDUCTOR LASER DIODE WITH HIGHER-ORDER MODE ABSORPTION LAYERS

(75) Inventors: Sang Ho Yoon, Kyungki-do (KR); Gueorgui Pak, Kyungki-do (KR); In Eung Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 263 days.

(21) Appl. No.: 10/812,029

(22) Filed: Mar. 30, 2004

(65) Prior Publication Data

US 2004/0264532 A1 Dec. 30, 2004

(30) Foreign Application Priority Data

Jun. 25, 2003 (KR) .................. 10-2003-0041617

(51) Int. Cl.
*H01S 3/098* (2006.01)
*H01S 5/20* (2006.01)
*H01S 5/00* (2006.01)

(52) U.S. Cl. ................. 372/45.01; 372/19; 372/45.013
(58) Field of Classification Search ................ 372/19, 372/45.01, 45.013

See application file for complete search history.

(56) References Cited

U.S. PATENT DOCUMENTS

| | | | | |
|---|---|---|---|---|
| 5,202,895 A | * | 4/1993 | Nitta et al. | 372/45.01 |
| 5,383,214 A | | 1/1995 | Kidoguchi et al. | |
| 5,521,935 A | * | 5/1996 | Irikawa | 372/45.011 |
| 6,172,998 B1 | * | 1/2001 | Horie et al. | 372/46.01 |
| 6,366,595 B1 | | 4/2002 | Bowler | |
| 6,400,742 B1 | * | 6/2002 | Hatakoshi et al. | 372/46.01 |
| 6,807,213 B1 | * | 10/2004 | Shimoyama et al. | 372/49.01 |
| 6,947,461 B1 | * | 9/2005 | Nakayama | 372/44.01 |
| 6,978,067 B1 | * | 12/2005 | Herbert et al. | 385/39 |
| 2002/0016014 A1 | * | 2/2002 | Kimura | 438/22 |

FOREIGN PATENT DOCUMENTS

| | | | |
|---|---|---|---|
| EP | 0 798 832 A2 | | 10/1997 |
| JP | 62001290 | | 1/1987 |
| JP | 06334260 A | * | 12/1994 |
| JP | 07022695 A | * | 1/1995 |

* cited by examiner

*Primary Examiner*—Minsun Oh Harvey
*Assistant Examiner*—Kelly Rogers
(74) *Attorney, Agent, or Firm*—Lowe Hauptman & Berner, LLP.

(57) ABSTRACT

A semiconductor laser diode capable of achieving an improvement in kink level and an improvement in catastrophic optical damage (COD) level. The semiconductor laser diode includes a first-conductivity type semiconductor substrate, a first-conductivity type clad layer formed over the substrate, an active layer formed over the first-conductivity type clad layer, a second-conductivity type clad layer formed over the active layer, and provided with a ridge, and a light confining layer formed on the second-conductivity type clad layer, and made of a first-conductivity type semiconductor material, the light confining layer including higher-order mode absorption layers having an energy band gap lower than optical energy produced in the active layer, and refractive index control layers having a refractive index lower than that of the higher-order mode absorption layers. The higher-order mode absorption layers and refractive index control layers are laminated in an alternate manner.

9 Claims, 7 Drawing Sheets

SEMICONDUCTOR LASER DIODE WITH HIGHER-ORDER MODE ABSORPTION LAYERS

BACKGROUND OF THE INVENTION

1. Field of the Invention

The present invention relates to a semiconductor laser diode, and more particularly to a semiconductor laser diode in which higher-order mode absorption layers of a superlattice structure are formed, thereby being capable of achieving an improvement in kink level and an improvement in catastrophic optical damage (COD) level.

2. Description of the Related Art

Generally, semiconductor laser devices are used for light sources of optical pickup devices in optical disc systems such as CD-RW and DVD-RW. Also, they are widely applied to diverse technical fields such as information and image processing, measuring, communication, and medical treatment. Such semiconductor laser diodes used in diverse technical fields are required to exhibit high power, a high COD level, and a high kink level.

FIG. 1 illustrates an example of a conventional high power semiconductor laser diode. As shown in FIG. 1, the high power semiconductor laser diode includes a first-conductivity type semiconductor substrate 12 formed with a first electrode 11 at a lower surface thereof. The high power semiconductor laser diode also includes a first-conductivity type clad layer 13, an active layer 14 having a multi-quantum well structure, and a second-conductivity type clad layer 15 formed with a ridge 15a, which are sequentially formed over an upper surface of the first-conductivity type semiconductor substrate 12. A current confining layer 16 is formed on the second-conductivity type clad layer 15 around the ridge 15a. A contact layer 17 is also formed to cover the upper surfaces of the current confining layer 16 and ridge 15a. A second electrode 18 is formed over the contact layer 17.

In the conventional semiconductor laser diode having the above mentioned structure, its ridge 15a is narrow while having a sharp slope in order to achieve an increase in laser power. In order to form the ridge 15a having such a sharp slope, a dry etching process using plasma is carried out. Where such a narrow ridge having a sharp slope is used, it is possible to achieve an improvement in kink level and an increase in laser power because the laser generating region x in the active layer 14 is narrowed. However, such a narrow laser generating region causes an increase in the optical density per area, thereby resulting in an increase in COD. As a result, a decrease in optical power occurs. In severe cases, oscillation of light may be ceased. This is because the light oscillated from the active layer may be absorbed into the light emitting facet of the semiconductor laser diode, thereby increasing the temperature of the light emitting facet, or fusing the light emitting facet in severe cases, and thus, breaking the device.

Furthermore, where the dry etching process using plasma, damage caused by the plasma remains at the etched region. As a result, there is an adverse affect on the characteristics of the semiconductor laser diode and a degradation in the reliability of the semiconductor laser diode.

FIG. 2 illustrates another example of a conventional high power laser diode. As shown in FIG. 2, the high power semiconductor laser diode includes a first-conductivity type semiconductor substrate 22 formed with a first electrode 21 at a lower surface thereof. The high power semiconductor laser diode also includes a first-conductivity type clad layer 23, an active layer 24 having a multi-quantum well structure, and a second-conductivity type clad layer 25 formed with a ridge 25a, which are sequentially formed over an upper surface of the first-conductivity type semiconductor substrate 22. A light confining layer 26 is formed over the second-conductivity type clad layer 25. The light confining layer 26 has a ridge 26a having a width larger than that of the ridge 25a formed at the second-conductivity type clad layer 25 while having a refractive index lower than that of the second-conductivity type clad layer 25. A current confining layer 27 made of a first-conductivity type semiconductor material is formed on the light confining layer 26 around the ridge 26a.

In this semiconductor laser diode, formation of a desired ridge structure is achieved by forming the ridge 25a made of a material having a high refractive index at the second-conductivity type clad layer 25 through a wet etching process, forming the light confining layer 26 having a refractive index lower than that of the second-conductivity type clad layer 25 through a secondary growth process without using any oxide film, and subsequently forming the current confining layer 27 made of a first-conductivity type semiconductor material through a third growth process. In the semiconductor laser diode having such a structure, the ridge 25a formed at the second-conductivity type clad layer 25 forms a light confining region y, whereas the ridge 26a formed at the light confining layer 26 forms a current confining region z.

Thus, the above mentioned conventional semiconductor laser diode increases the width of the ridge structure by separating regions for carrier confinement and optical confinement from each other, thereby achieving an improvement in COD level. In this semiconductor laser diode in which its optical density per area is reduced in accordance with an increase in ridge width, thereby achieving an improvement in COD level, however, there is a problem in that when the optical power of oscillated lasers increases, higher-order modes may be generated, thereby causing a degradation in kink level. Now, generation of a kink will be described in detail with reference to FIGS. 3a and 3b.

FIG. 3a is a graph depicting a variation in laser power in a lateral (width) direction of a semiconductor laser diode. When the semiconductor laser diode begins to operate, and subsequently performs a normal operation, the laser power thereof is exhibited in the form of a Gauss curve. That is, the laser power has a peak at the width center of the active layer, that is, a portion of the active layer corresponding to the center of the ridge width, as shown in FIG. 3a. This laser power is referred to as a "fundamental mode laser power". However, when the laser power increases, respective numbers of electrons and holes present at the width center of the active layer are decreased. When such a reduction in the numbers of electrons and holes reaches a certain level, two laser power peaks are exhibited at portions of the active layer spaced apart from the width center of the active layer by a certain distance at opposite sides of the width center of the active layer, respectively (regions A and B). The laser power with such peaks is referred to as a "first-order mode laser power". As the laser power further increases, the number of peaks increases. Such modes other than the fundamental mode are referred to as "higher-order modes". In such higher-order modes, the output power of the semiconductor laser diode may be degraded. Such a problem is called a "kink".

FIG. 3b is a graph depicting the relation between the current injected into the semiconductor laser diode and the optical power of the semiconductor laser diode. Referring to FIG. 3b, it can be seen that although the optical power of the oscillated laser increases linearly to a certain level $P_o$ in accordance with an increase in the amount of the injected current, such a linear increase is no longer obtained after the optical power reaches the level $P_o$. This is because a kink occurs due to oscillation in a higher-order mode. In FIG. 3b, the bent graph portion corresponds to a point where a kink occurs.

Thus, a kink occurs when oscillation in a higher-order mode occurs. Due to such a kink, there is a problem of a degradation in the laser characteristics associated with irradiation position of a laser, laser power, etc. Accordingly, it is important to raise the level at which a kink occurs (that is, the kink level), so as to achieve a stable oscillation of a high-power laser.

Therefore, in the technical field, it has been required to provide a new semiconductor laser diode which can prevent generation of COD while suppressing oscillation in a higher-order mode even when a high-power laser is generated, thereby raising the kink level, so that it can stably oscillate a high-power laser.

SUMMARY OF THE INVENTION

The present invention has been made in view of the above mentioned problems, and an object of the invention is to provide a semiconductor laser diode which can absorb a kink possibly occurring due to an increase in the optical power thereof, through higher-order mode absorption layers, thereby being capable of preventing generation of COD even in a super-high power output state while maintaining a high kink level.

In accordance with the present invention, this object is accomplished by providing a semiconductor laser diode comprising: a first-conductivity type semiconductor substrate; a first-conductivity type clad layer formed over the substrate; an active layer formed over the first-conductivity type clad layer; a second-conductivity type clad layer formed over the active layer, and provided with a ridge; a light confining layer formed on the second-conductivity type clad layer around at least the ridge, while including one or more higher-order mode absorption layers having an energy band gap lower than optical energy produced in the active layer, the light confining layer having a refractive index lower than the second-conductivity type clad layer; and a current confining layer formed over the light confining layer, the current confining layer being made of a first conductivity-type semiconductor material.

In a preferred embodiment of the present invention, the light confining layer may further include one or more refractive index control layers having a refractive index lower than that of the higher-order mode absorption layers. The refractive index control layers may be laminated along with the higher-order mode absorption layers in an alternate manner. The light confining layer may further include a low refractive index layer having a refractive index equal to or lower than an average index of the higher-order mode absorption layers and refractive index control layers.

The higher-order mode absorption layers may be made of a second-conductivity type AlGaAs or AlGaInP-based material. The refractive index control layers may be made of a second-conductivity type AlGaAs or AlGaInP-based material. The higher-order mode absorption layers may have an Al content determined to make the higher-order mode absorption layers have an energy band gap capable of absorbing a wavelength of light produced in the active layer. The refractive index control layers may have an Al content higher than that of the higher-order mode absorption layers so that the refractive index of the light confining layer is lower than that of the second-conductivity type clad layer.

Thus, the semiconductor laser diode of the present invention has a structure in which the higher-order mode absorption layers for absorbing optical energy caused by oscillation in a higher-order mode are provided at the light confining layer formed over the second-conductivity type clad layer, so that it can prevent generation of a kink caused by oscillation in a higher-order mode when the optical power of the semiconductor laser diode increases.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Figure 4A:
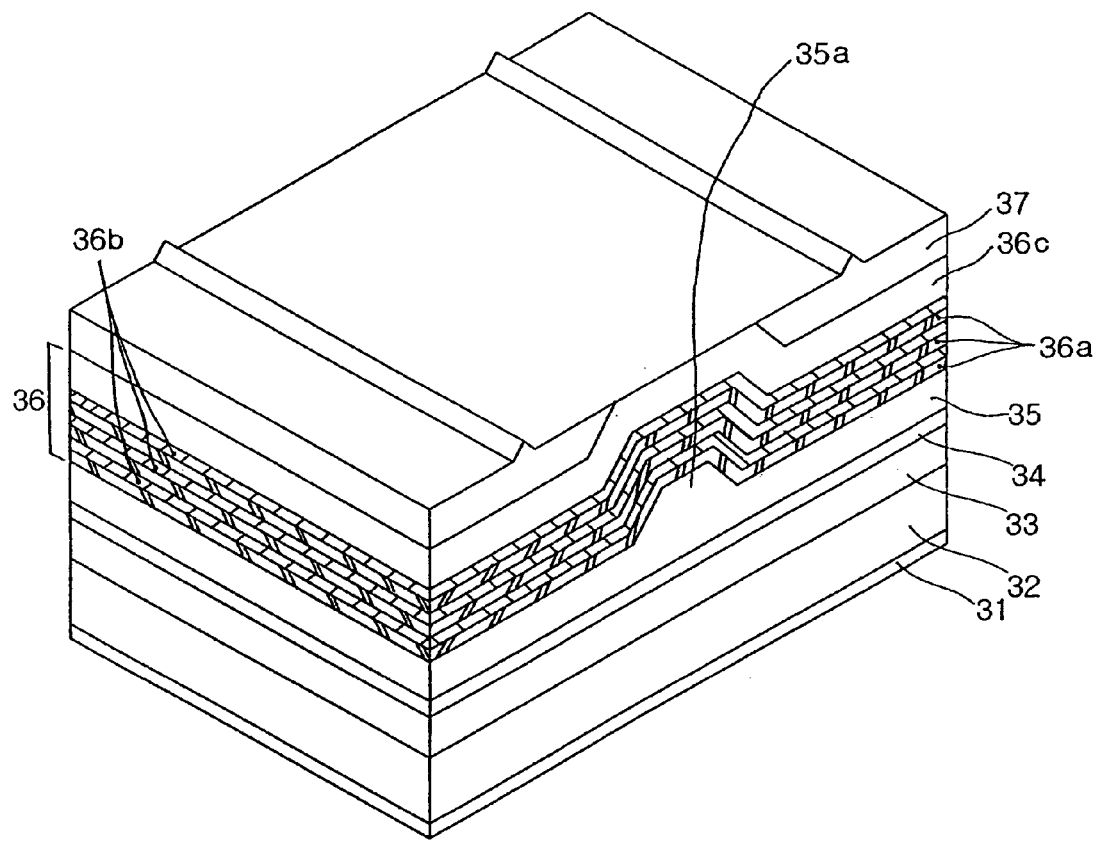
FIG. 4a is a perspective view illustrating a semiconductor laser diode in accordance with an embodiment of the present invention.

FIG. 4a illustrates a semiconductor laser diode having higher-order absorption layers in accordance with an embodiment of the present invention. As shown in FIG. 4, the semiconductor laser diode includes a first-conductivity type semiconductor substrate 32 formed, at a lower surface thereof, with a first electrode 31 made of a certain alloy, a first-conductivity type clad layer 33 formed over the substrate 32, an active layer 34 formed over the first-conductivity type clad layer 33, a second-conductivity type clad layer 35 formed over the active layer 34 while having a ridge 35a, and a light confining layer 36 formed over the second-conductivity type clad layer 35 while having a refractive index lower than that of the second-conductivity type clad layer 35. The light confining layer 36 has a multi-layer structure including higher-order mode absorption layers 36a and refractive index control layers 36b which are alternately laminated. Although the light confining layer 36 includes three higher-order mode absorption layers 36a and three refractive index control layers 36b, which are alternately arranged, respective numbers of the layers 36a and 36b are not limited to three. The light confining layer 36 further includes a low refractive index layer 36c having a refractive index substantially equal to the average of the refractive index of the higher-order mode absorption layers 36a and the refractive index of the refractive index control layers 36b. A current confining layer 37 made of a first-conductivity type semiconductor material is formed over the light confining layer 36.

The first-conductivity type semiconductor substrate 32 may be an n type GaAs substrate. Also, the first-conductivity type clad layer 33 and second-conductivity type clad layer 34 are made of n type and p type AlGaAs materials, respectively. The active layer 33 has a multi-quantum well structure having a predetermined oscillation wavelength. The above described layers are sequentially and continuously formed in the above described order. This layer formation is referred to as a "primary growth procedure". Although the substrate 32 is provided at its lower surface with the first electrode 31, it is not limited to such a structure. Meanwhile, although not shown, a buffer layer made of an n type GaAs material may be interposed between the substrate 32 and the first-conductivity type clad layer 33. However, this buffer layer is adapted only for a crystal alignment between the substrate 32 and the first-conductivity type clad layer 33. Accordingly, this buffer layer will be described as being included in the substrate 32 in the following description and the claims.

After completion of the primary growth procedure, a mask is formed on the second-conductivity type clad layer 35. The region where the mask is arranged corresponds to a region where a ridge is to be formed. That is, as the mask region is not etched in a subsequent etching process, the ridge will be formed. For the mask, a dielectric film, for example, an oxide film such as an $SiO_2$ film or a nitride film such as an SiN film, may be used. An etch stop layer (not shown) may be included in the second-conductivity type clad layer 35 so as to prevent the second-conductivity type clad layer 35 from being excessively etched in an etching process. Thereafter, the ridge 35a is formed at the second-conductivity type clad layer 35 through an etching process.

Subsequently, the light confining layer 36 is formed over the second-conductivity type clad layer 35 formed with the ridge 35a. As described above, the light confining layer 36 includes the higher-order mode absorption layers 36a, refractive index control layers 36b, and low refractive index layer 36c. Although the light confining layer 36 includes these layers 36a, 36b, and 36c in the illustrated embodiment, it is not limited thereto. In the illustrated embodiment, three higher-order mode absorption layers 36a and three refractive index control layers 36b are alternately laminated over the second-conductivity clad layer 35. The higher-order mode absorption layers 36a serve to absorb optical energy caused by oscillation in a higher-order mode, whereas the refractive index control layers 36b serve to compensate for a reduction in refractive index caused by the higher-order mode absorption layers 36a. That is, the light confining layer 36 serves to absorb optical energy caused by oscillation in a higher-order mode while suppressing light from the ridge 35a from passing therethrough, by the higher-order absorption layers 36a and refractive index control layers 36b.

Figure 1:
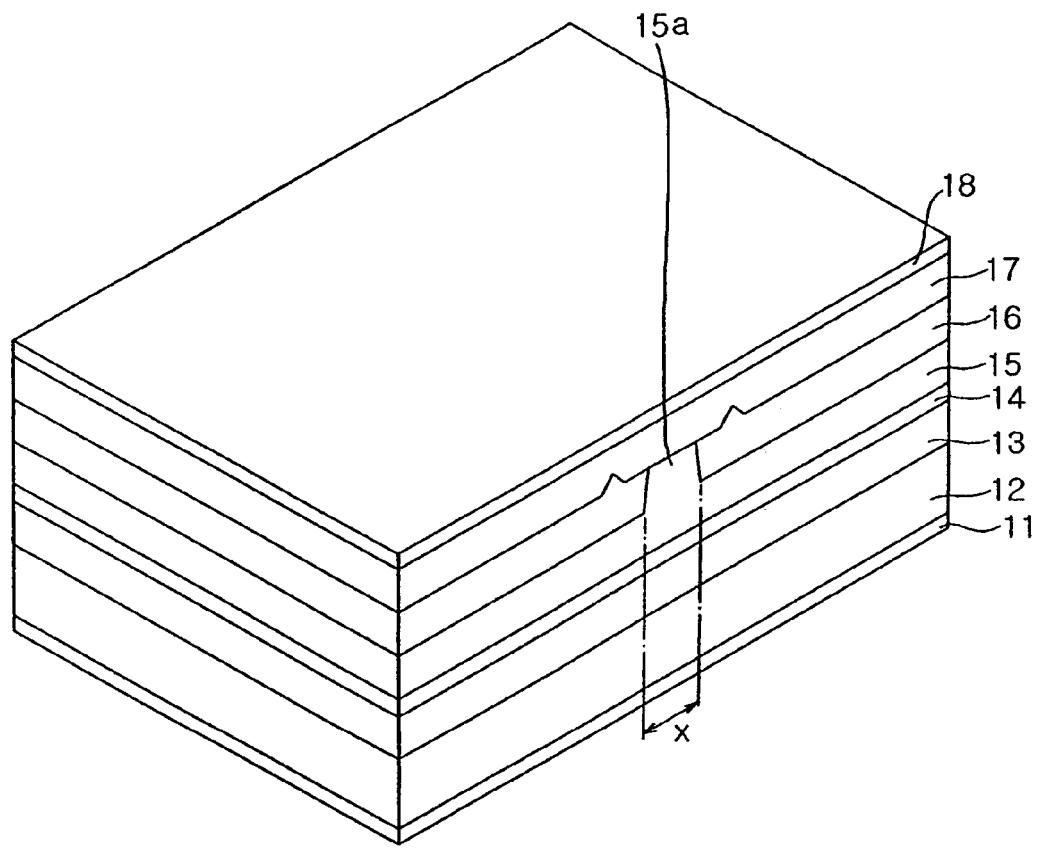
FIGS. 1 and 2 are perspective views illustrating examples of conventional semiconductor laser diodes, respectively.
Figure 2:
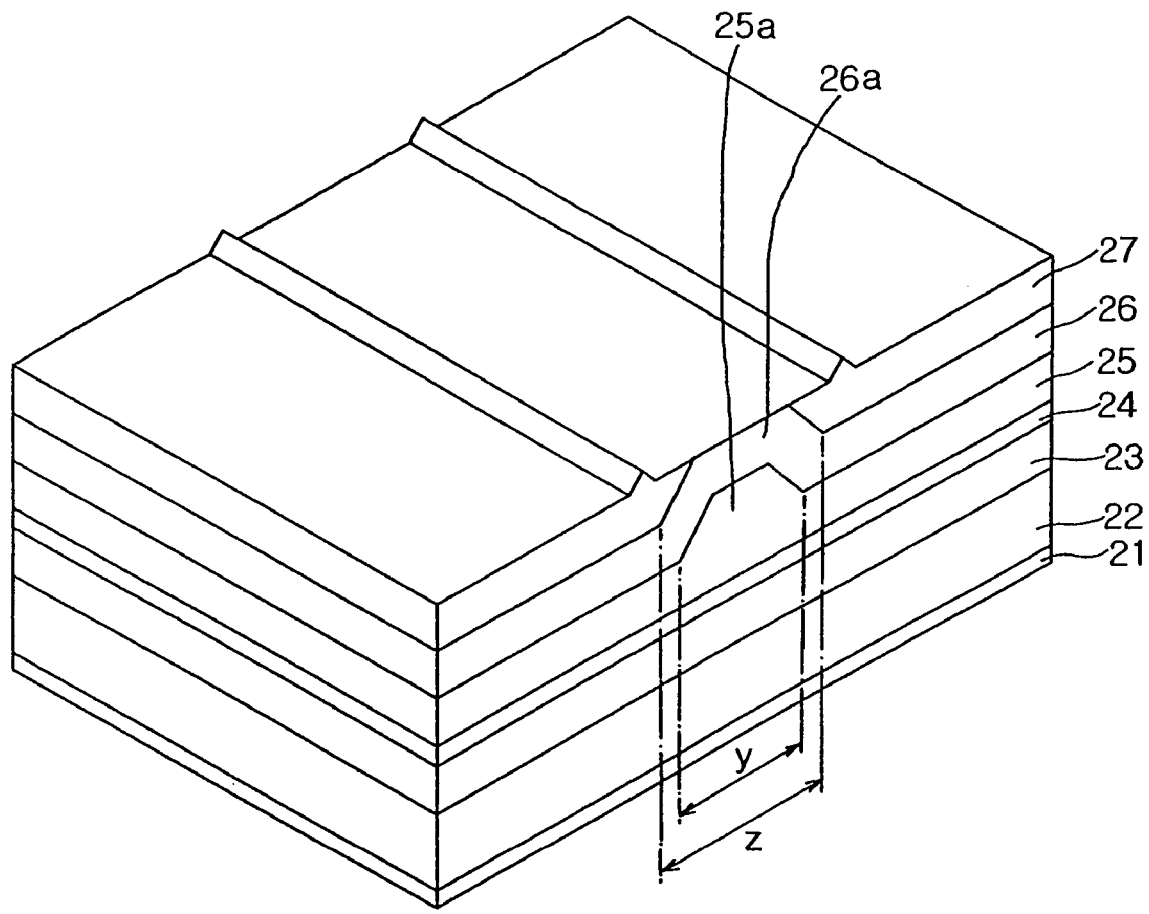
Figure 3A:
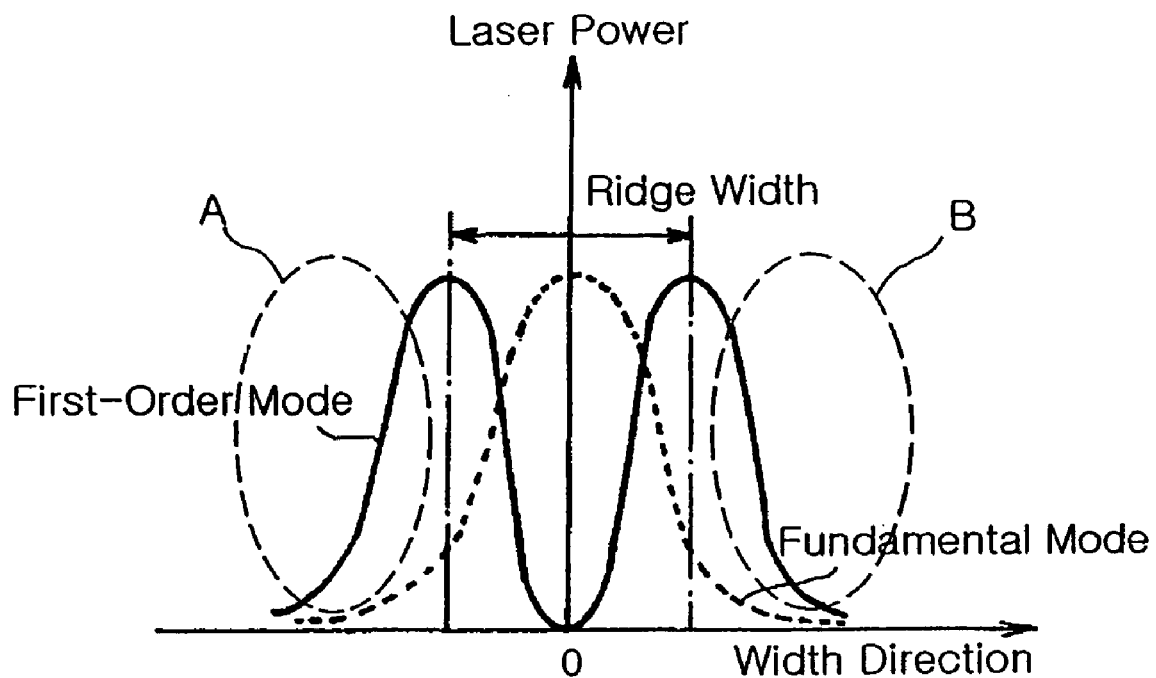
FIG. 3a is a graph depicting a variation in laser power in a lateral direction (width) of a semiconductor laser diode.
Figure 3B:
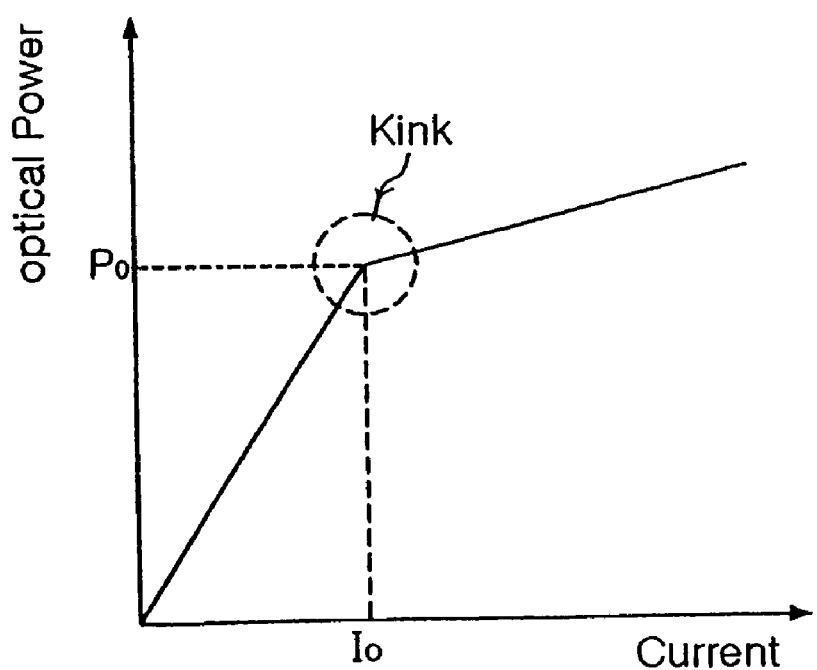
FIG. 3b is a graph depicting the relation between the current injected into a semiconductor laser diode and the optical power of the semiconductor laser diode.

In the illustrated embodiment, for the formation of the light confining layer 36, one higher-order mode absorption layer 36a is first formed over an upper surface of the second-conductivity type clad layer 35. The higher-order mode absorption layer 36a is made of a p type AlGaAs layer having a reduced Al content so that it has an energy band gap set to be lower than optical energy caused by oscillation in a higher-order mode. In the illustrated embodiment, the higher-order mode absorption layer 36a has an Al content of 0.106 wt %. Optical energy caused by oscillation in a second-order mode while exhibiting peaks at outer regions of the ridge width (regions A and B in FIG. 3) is absorbed by the higher-order mode absorption layer 36a having an energy band gap lower than the optical energy. As higher-order mode optical energy is absorbed through the higher-order absorption layer 36a, it is possible to suppress oscillation in a higher-order mode and generation of a kink, while improving optical power of the fundamental mode. Meanwhile, the characteristics of the semiconductor laser diode are influenced by the thickness of the higher-order mode absorption layer 36a. This will be described in detail hereinafter.

On the other hand, the higher-order mode absorption layer 36a exhibits an increased refractive index as it has a very low Al content. Accordingly, light may easily pass through the higher-order mode absorption layer 36a. However, it is necessary to confine light within the ridge. To this end, one refractive index control layer 36b is formed over an upper surface of the higher-order mode absorption layer 36a in order to compensate for an increase in refractive index caused by the higher-order mode absorption layer 36a. Through the refractive index control by the refractive index control layer 36b, it is necessary to set the average of the refractive index of the higher-order mode absorption layer 36a and the reflective index of the refractive index control layer 36b to be lower than the refractive index of the second-conductivity clad layer 35. This is because the higher-order mode absorption layer 36a and refractive index control layer 36b simultaneously perform the function of the light confining layer for preventing light from traveling outwardly from the ridge 35a. In accordance with the illustrated embodiment, the refractive index control layer 36b is made of a p type AlGaAs-based material having an Al content of 0.7 wt %.

Although the light confining layer 36 is formed by first forming one higher-order mode absorption layer 36a over the second-conductivity type clad layer 35, and then forming one refractive index control layer 36b over the higher-order mode absorption layer 36b, in the illustrated embodiment, the formation of the light confining layer 36 is not limited thereto. Also, the formation order of the layers 36a and 36b may be changed.

The light confining layer 36 includes at least one higher-order mode absorption layer 36a and at least one refractive index control layer 36b (three layers 36a and three layers 36b in the illustrated embodiment). The higher-order mode absorption layer 36a should be relatively thin. Where the higher-order mode absorption layer 36a has a large thickness, the light confining effect of the light confining layer 36 is degraded in proportional to the thickness of the higher-order mode absorption layer 36a because the higher-order mode absorption layer 36a exhibits a high refractive index by virtue of its low Al content. In other words, light travels along a path increased in length in proportional to the thickness of the higher-order mode absorption layer 36a, so that the light confining effect is degraded. Accordingly, the higher-order mode absorption layer 36a and refractive index control layer 36b should be relatively thin. In this case, however, it is impossible to sufficiently absorb optical energy caused by oscillation in a higher-order mode, only by one higher-order mode absorption layer 36a. Accordingly, it is preferable to alternately laminate a plurality of higher-order mode absorption layers 36a and a plurality of refractive index control layers 36b.

The low refractive index layer 36c may be formed over an upper surface of the structure of the alternately laminated higher-order mode absorption layers 36a and refractive index control layers 36b. The refractive index of the low refractive index layer 36c is set to be lower than that of the second-conductivity type clad layer 35, in order to prevent light from traveling outwardly from the ridge. In particular, it is preferred that the low refractive index layer 36c have a refractive index substantially equal to or lower than the average of the refractive index of the higher-order mode absorption layers 36a and the refractive index of the refractive index control layers 36b. Under this condition, the low refractive index layer 36c can provide substantially the same light confining effect as that of the higher-order mode absorption layers 36a and refractive index control layers 36b. In the illustrated embodiment, the low refractive index layer 36c is a p type AlGaAs layer having an Al content of 0.48 wt %. The low refractive index layer 36c may be dispensed with in so far as a sufficient light confining effect is obtained simply by the alternately laminated higher-order mode absorption layers 36a and refractive index control layers 36b.

Thereafter, the current confining layer 37 adapted to confine current within the ridge region is formed around the ridge on the light confining layer 36. The current confining layer 37 is made of a first-conductivity type semiconductor material. This current confining layer 37 confines current within the ridge region, thereby preventing current from being dispersed toward opposite lateral ends of the semiconductor laser diode. After the formation of the current confining layer 37, the first electrode 31 made of a certain alloy is formed at the lower surface of the substrate 32. A second electrode (not shown) made of a certain alloy may also be formed to cover the upper surfaces of the light confining layer 36 and current confining layer 37. In this case, an ohmic contact layer (not shown) may also be formed between the current confining layer 37 and the second electrode.

Figure 4B:
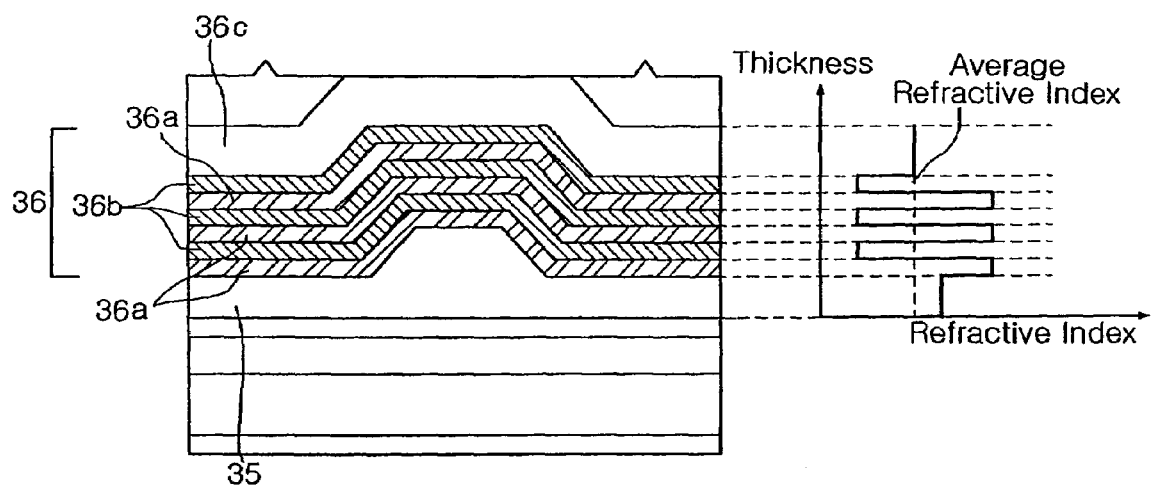
FIG. 4b shows respective cross-sectional structures of layers included in the semiconductor laser diode according to the embodiment of the present invention by a cross-sectional view, and respective refractive indexes of those layers by a graph.

FIG. 4b shows respective cross-sectional structures of the layers included in the semiconductor laser diode according to the present invention by a cross-sectional view, and respective refractive indexes of those layers by a graph. As described above, the second-conductivity type clad layer 35 has a refractive index higher than that of the light confining layer 36. The higher-order mode absorption layers 36a may have a refractive index higher than that of the second-conductivity type clad layer 35 because it has a low Al content in order to set its energy band gap to be lower than optical energy caused by oscillation in a higher-order mode. In order to compensate for such a high refractive index of the higher-order mode absorption layers 36a, the refractive index control layers 36b have a high Al content so that they have a very low refractive index. That is, the average of the refractive indexes of the higher-mode absorption layers 36a and refractive index control layers 36b is controlled to be lower than the refractive index of the second-conductivity type clad layer 35. Thus, a desired light confinement can be achieved through the higher-order mode absorption layers 36a and refractive index control layers 36b. Preferably, the low refractive index layer 36c, which performs an additional light confinement to make the light confining layer 36 provide a sufficient light confining effect, has a refractive index substantially equal to or lower than the average refractive index of the higher-order mode absorption layers 36a and refractive index control layers 36b.

Now, the relation between the thickness of the higher-order mode absorption layers and the characteristics of the semiconductor laser diode will be described in detail with reference to FIGS. 5 to 7. Values described in the following description are experimental values for the semiconductor laser diode including the higher-order mode absorption layers having an Al content of 0.106 wt % in accordance with the illustrated embodiment of the present invention. These values are presented only for best understanding of the present invention, so that the present invention is not limited thereto.

Figure 5:
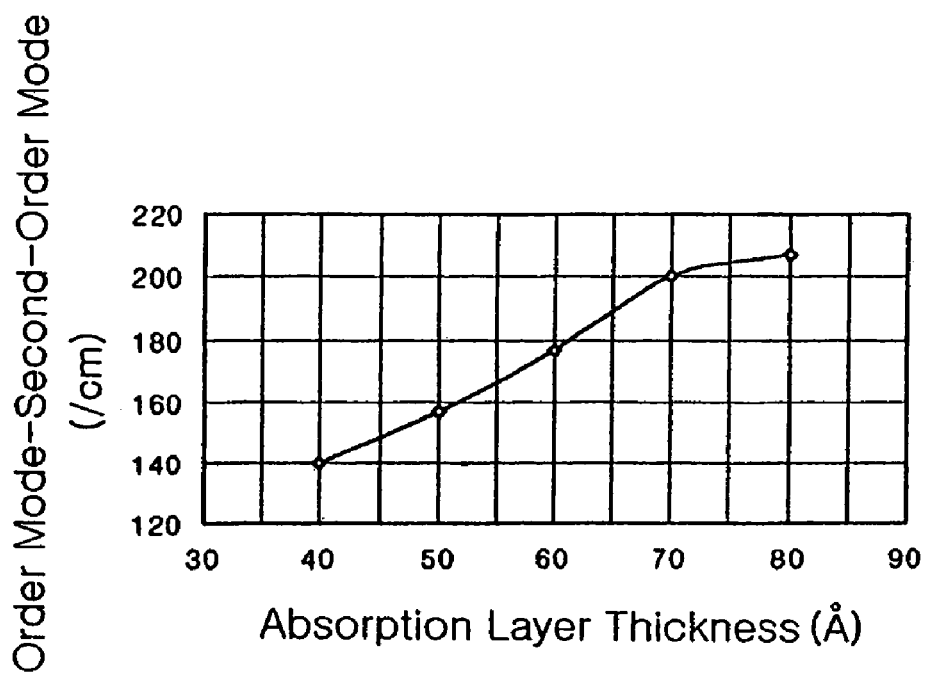
FIG. 5 is a graph depicting the relation between the thickness of higher-order mode absorption layers according to the embodiment of the present invention and a difference between internal loss in a first-order mode and internal loss in a fundamental mode.

FIG. 5 is a graph depicting the relation between the thickness of the higher-order mode absorption layers according to the embodiment of the present invention and a difference between internal loss in a first-order mode and internal loss in a fundamental mode. Generally, oscillation of a laser in a semiconductor laser diode is caused by stimulated emission of photons. The number of photons emitted when a photon is stimulated while passing through an optical path of a unit length is called an "optical gain". Also, the number of photons again absorbed after being emitted is referred to as an "internal loss". In semiconductor laser diodes, it is necessary to increase the internal loss caused by laser oscillation in a higher-order mode while reducing the internal loss caused by laser oscillation in a fundamental mode because it is desirable to eliminate laser oscillation in a higher-order mode in a semiconductor laser diode. In other words, it is necessary to increase the difference between the internal loss in a higher-order mode and the internal loss in a fundamental mode.

FIG. 5 depicts a variation in the difference between the internal loss in the first-order mode and the internal loss in the fundamental mode depending on the higher-order mode absorption layer thickness. Referring to FIG. 5, it can be seen that the internal loss in a higher-order mode increases as the higher-order mode absorption layer thickness increases, so that the difference between the internal loss in the higher-order mode and the internal loss in the fundamental mode increases. In other words, when the higher-order mode absorption layer thickness increases, laser oscillation in a higher-order mode is reduced, so that laser oscillation in the fundamental mode increases, thereby causing the kink level to be raised.

Figure 6:
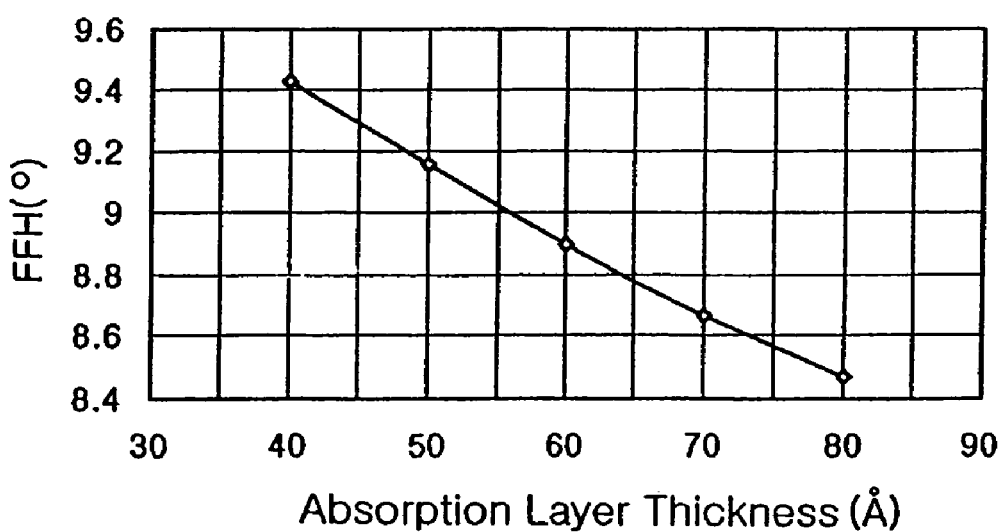
FIG. 6 is a graph depicting the relation between the thickness of the higher-order mode absorption layers according to the embodiment of the present invention and a far field horizontal (FFH) angle.

FIG. 6 is a graph depicting the relation between the thickness of the higher-order mode absorption layers according to the embodiment of the present invention and a far field horizontal (FFH) angle. Referring to FIG. 6, it can be seen that a reduction in FFH occurs as the higher-order mode absorption layer thickness increases. "FFH" means a horizontal divergence angle of a laser when it is outwardly emitted from the light emitting facet of a semiconductor laser diode. As the higher-order mode absorption layer thickness increases, the horizontal divergence angle decreases. This is because the light confining function in a semiconductor laser diode is ineffectively carried out at an increased higher-order mode absorption layer thickness, so that dispersion of light around the ridge increases. When the dispersed light is outwardly emitted from the semiconductor laser diode, it is subjected to diffraction, so that its emission angle is reduced. In accordance with the present invention, it is possible to additionally control the FFH by controlling the higher-order mode absorption layers and refractive index control layers.

Figure 7:
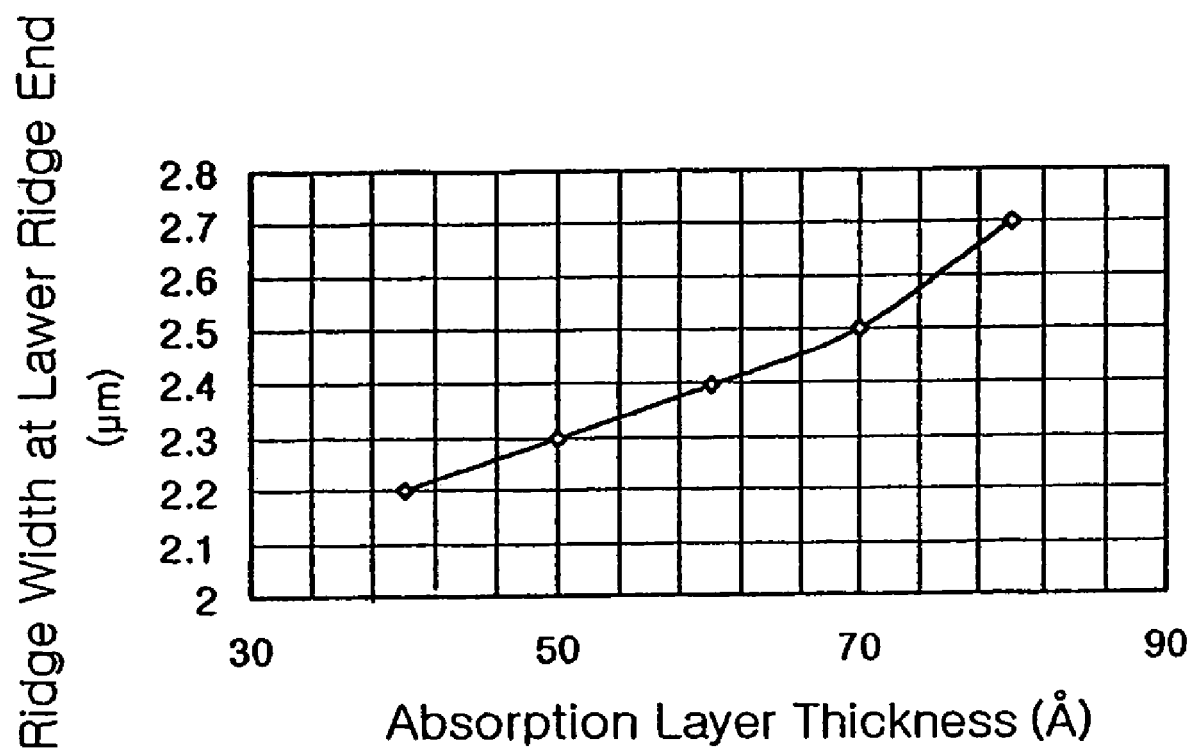
FIG. 7 is a graph depicting the relation between the thickness of the higher-order mode absorption layers according to the embodiment of the present invention and the width of the ridge.

FIG. 7 is a graph depicting the relation between the thickness of the higher-order mode absorption layers according to the embodiment of the present invention and the width of the ridge. In FIG. 7, the lower end of each line corresponds to a region where laser oscillation in a fundamental mode occurs, whereas the upper end of each line corresponds to a region where laser oscillation in a higher-order mode occurs. That is, the point where two adjacent lines are connected is the boundary between the laser oscillation in a fundamental mode and the laser oscillation in a higher-order mode. For example, where the higher-order mode absorption layer thickness is 70 Å, laser oscillation in a higher-order mode occurs when the ridge has a width of more than 2.5 μm at its lower end. On the other hand, when the width of the ridge is not more than 2.5 μm, laser oscillation in a fundamental mode occurs. In other words, where the ridge has a large width, laser oscillation in a higher-order mode may occur easily because the width of a region where a laser oscillates is large. In this case, accordingly, it is necessary to increase the higher-order mode absorption layer thickness in order to increase the rate of absorbing optical power in a higher-order mode.

Thus, the thickness of the higher-order mode absorption layers in a semiconductor laser diode has a close relation to the efficiency of absorbing optical power in a higher-order mode, the FFH of a laser emitted from the semiconductor laser diode, and the width of a ridge provided at the semiconductor laser diode. Therefore, it is possible to manufacture a semiconductor laser diode of a desired standard by appropriately controlling the thickness of the higher-order mode absorption layers.

As described above in conjunction with the embodiment of the present invention, the present invention is characterized by forming, in a semiconductor laser diode, a higher-order mode absorption layer having a low energy band gap while serving to absorb optical energy caused by oscillation in a higher-order mode, in order to prevent generation of a kink caused by oscillation in a higher-order mode when the optical power of the semiconductor laser diode increases.

Furthermore, the present invention is characterized by arranging, on the higher-order mode absorption layer, a refractive index control layer for compensating for a high refractive index of the higher-order mode absorption layer, while controlling the average refractive index of the higher-order mode absorption layer and refractive index control layer to be lower than the refractive index of a second-conductivity type clad layer formed with a ridge, thereby confining light within the ridge. Accordingly, it is possible to absorb optical energy caused by oscillation in a higher-order mode while preventing diffusion of light, and thus, to provide a high-power semiconductor laser diode exhibiting a high kink level.

Although the above described embodiment of the present invention is associated with an AlGaAs-based semiconductor laser device, the present invention may also be applied to an AlGaInP-based semiconductor laser device adapted to oscillate a laser having a wavelength of 650 nm. In this case, an n type GaAs substrate is used for the first-conductivity type substrate. Also, the first-conductivity type clad layer and second-conductivity type clad layer are made of n and p type AlGaInP materials, respectively. The higher-order mode absorption layer is a p type AlGaInP layer having a very low content so that it has an energy band gap set to be lower than optical energy caused by oscillation in a higher-order mode. On the other hand, the refractive index control layer is made of a p type AlGaInP-based material having a high Al content. Also, the average refractive index of the higher-order mode absorption layer and refractive index control layer is controlled such that it is lower than the refractive index of the second-conductivity type clad layer. The low refractive index layer is a p type AlGaInP layer. The low refractive index layer has a refractive index equal to the average refractive index of the higher-order mode absorption layer and refractive index control layer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

As apparent from the above description, the present invention provides a semiconductor laser diode including a ridge having a large width to achieve a reduction in COD, while including a higher-order mode absorption layer adapted to absorb optical energy caused by oscillation in a higher-order mode possibly occurring due to the large width of the ridge, thereby suppressing generation of a kink caused by the higher-order mode oscillation, and confining light within the ridge region. Accordingly, the semiconductor laser diode of the present invention has advantages of high power, high COD level, and high kink level.

What is claimed is:

1. A semiconductor laser diode comprising:
a first-conductivity type semiconductor substrate;
a first-conductivity type clad layer formed over the substrate;
an active layer formed over the first-conductivity type clad layer;
a second-conductivity type clad layer formed over the active layer, and provided with a ridge; and
a light confining layer formed on the second-conductivity type clad layer around at least the ridge, while including one or more higher-order mode absorption layers having an energy band gap lower than optical energy produced in the active layer, the light confining layer having a refractive index lower than the second-conductivity type clad layer.

2. The semiconductor laser diode according to claim 1, wherein the light confining layer further includes one or more refractive index control layers having a refractive index lower than that of the higher-order mode absorption layers, the refractive index control layers being laminated along with the higher-order mode absorption layers in an alternate manner.

3. The semiconductor laser diode according to claim 1, wherein the light confining layer further includes a low refractive index layer having a refractive index equal to or lower than an average index of the higher-order mode absorption layers and refractive index control layers.

4. The semiconductor laser diode according to claim 1, further comprising:
a current confining layer formed over the light confining layer, the current confining layer being made of a first conductivity-type semiconductor material.

5. The semiconductor laser diode according to claim 1, wherein the higher-order mode absorption layers are made of a second-conductivity type AlGaAs or AlGaInP-based material.

6. The semiconductor laser diode according to claim 2, wherein the refractive index control layers are made of a second-conductivity type AlGaAs or AlGaInP-based material.

7. The semiconductor laser diode according to claim 5, wherein the higher-order mode absorption layers have an Al content determined to make the higher-order mode absorption layers have an energy band gap capable of absorbing a wavelength of light produced in the active layer.

8. The semiconductor laser diode according to claim 6, wherein the refractive index control layers have an Al content higher than that of the higher-order mode absorption layers so that the refractive index of the light confining layer is lower than that of the second-conductivity type clad layer.

9. A semiconductor laser diode comprising:
- a first-conductivity type semiconductor substrate;
- a first-conductivity type clad layer formed over the substrate;
- an active layer formed over the first-conductivity type clad layer;
- a second-conductivity type clad layer formed over the active layer, and provided with a ridge; and
- a light confining layer formed on the second-conductivity type clad layer, and made of a first-conductivity type semiconductor material, the light confining layer including higher-order mode absorption layers having an energy band gap lower than optical energy produced in the active layer, and refractive index control layers having a refractive index lower than that of the higher-order mode absorption layers, the higher-order mode absorption layers and refractive index control layers being laminated in an alternate manner.

* * * * *